United States Patent
Chien et al.

Patent Number: 6,001,690
Date of Patent: *Dec. 14, 1999

[54] METHOD OF FORMING FLASH EPROM BY USING ISO+ANISO SILICON NITRIDE SPACER ETCHING TECHNOLOGY

[75] Inventors: Wen-Cheng Chien, Kao-Hsiung; Ming-Yi Lin, Hsin-Chu; Li-Ming Huang, Taipei; Chen-Peng Fan, Hsin Chu Hsien, all of Taiwan

[73] Assignee: Taiwan Semiconductor Manufacturing Company, Ltd., Hsin-Chu, Taiwan

[*] Notice: This patent is subject to a terminal disclaimer.

[21] Appl. No.: 09/023,066

[22] Filed: Feb. 13, 1998

[51] Int. Cl.$^6$ .................................................. H01L 21/336
[52] U.S. Cl. .......................... 438/266; 438/257; 438/303; 438/305
[58] Field of Search ..................................... 438/257, 258, 438/262, 263, 264, 265, 266, 286, 301, 303, 305, 306, 366, 595, 724, 734, 739, 744, 751, 757

[56] References Cited

U.S. PATENT DOCUMENTS

| | | | |
|---|---|---|---|
| 5,045,486 | 9/1991 | Chittipeddi et al. | 438/305 |
| 5,067,108 | 11/1991 | Jenq | 257/316 |
| 5,115,288 | 5/1992 | Manley | 257/316 |
| 5,278,087 | 1/1994 | Jenq | 438/264 |
| 5,371,028 | 12/1994 | Koh | 438/261 |
| 5,493,138 | 2/1996 | Koh | 257/314 |
| 5,554,869 | 9/1996 | Chang | 257/316 |
| 5,573,965 | 11/1996 | Chen et al. | 438/305 |
| 5,679,589 | 10/1997 | Lee et al. | 438/305 |
| 5,858,840 | 1/1999 | Hsieh et al. | 438/266 |
| 5,879,992 | 3/1999 | Hsieh et al. | 438/266 |
| 5,879,993 | 3/1999 | Chien et al. | 438/266 |

*Primary Examiner*—Charles Bowers
*Assistant Examiner*—Jack Chen
*Attorney, Agent, or Firm*—George O. Saile; Stephen B. Ackerman

[57] ABSTRACT

A method is provided for forming nitride spacers for flash EEPROM devices. A silicon nitride layer is formed over the floating gate in a memory cell. Unlike in conventional methods where the nitride layer is usually subjected to anisotropic etching, it is disclosed in this invention that when partial isotropic/anisotropic etching of a particular recipe is performed, the resulting nitride spacers are better controlled dimensionally with the attendant advantage, therefore, of better definition of gate and channel lengths during subsequent implantations. In a second embodiment, the partial isotropic/anisotropic etching is followed by full anisotropic etching of another recipe with even better defined parameters for the flash EEPROMS.

33 Claims, 3 Drawing Sheets

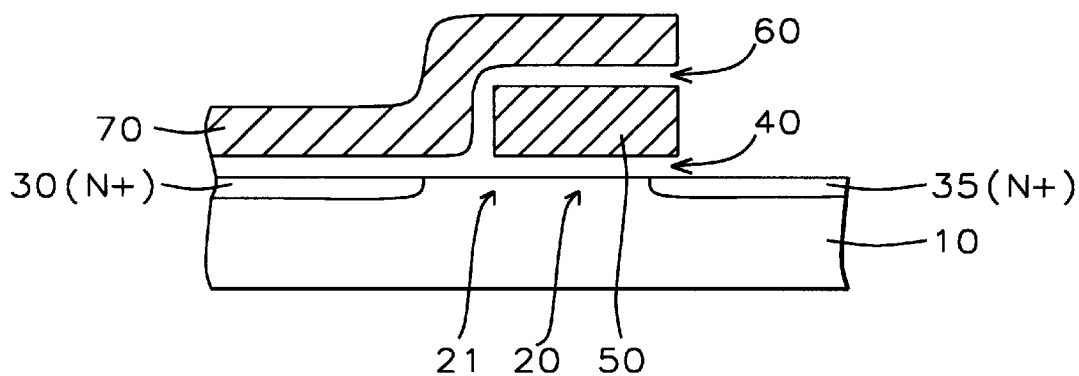
FIG. 1a – Prior Art
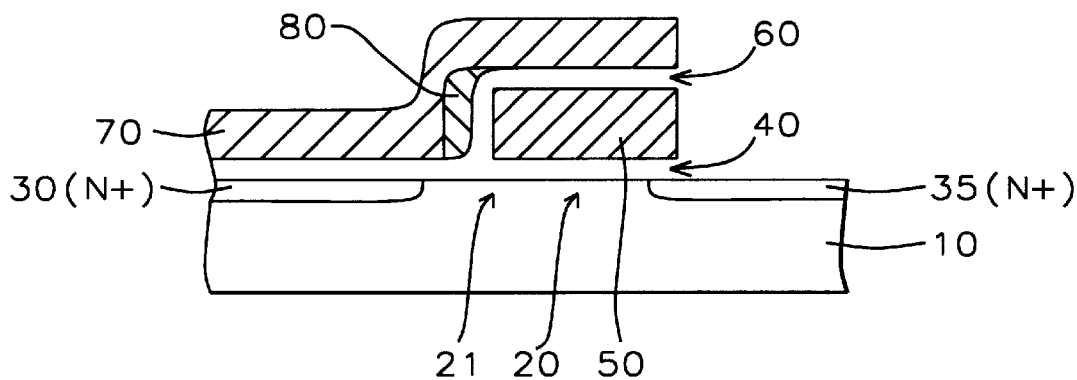
FIG. 1b – Prior Art
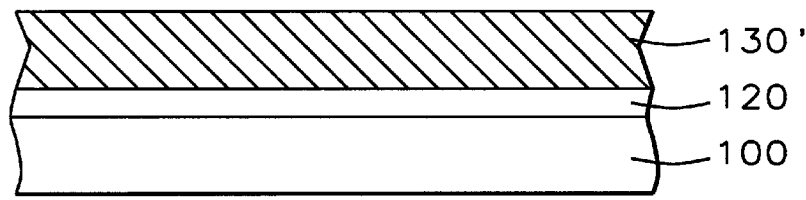
FIG. 2a
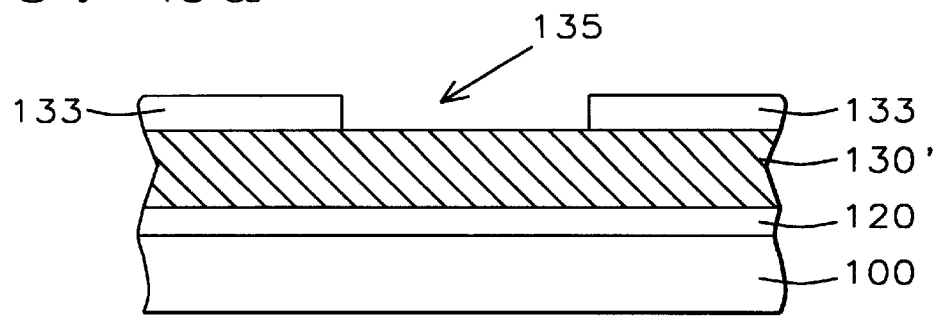
FIG. 2b

METHOD OF FORMING FLASH EPROM BY USING ISO+ANISO SILICON NITRIDE SPACER ETCHING TECHNOLOGY

BACKGROUND OF THE INVENTION (1) Field of the Invention

The present invention relates to the manufacture of flash-EEPROM cells (Electrically Erasable Programmable Read Only Memories), and in particular, to nitride spacer etching technology used in manufacturing flash-EEPROMs.

(2) Description of the Related Art

Most conventional flash-EEPROM cells use a double-polysilicon (poly) structure of which the well known split-gate cell is shown in FIG. 1a. Here, a MOS transistor is formed on substrate (10) and has a channel (20) defined by source (30) and drain (35), a floating gate (50) to which there is no direct electrical connection and a control gate (70) with a direct electrical connection. The floating gate is separated from the substrate by a thin layer of gate oxide (40) while the control gate is generally positioned over the floating gate with tunnel oxide and an interpoly dielectric therebetween, usually formed of oxide/nitride/oxide (ONO) composite film (60). In the structure shown in FIG. 1a, control gate (70) overlaps the channel region, (21), adjacent to the channel (20) under the floating gate, (50). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (21) determines the cell performance. Therefore, it is important as to how the transistor and gate length are defined, and nitride spacers, not shown in FIG. 1a, but disclosed in the embodiments of this invention later, can be used effectively for the purposes of precisely defining such cell parameters.

To program the transistor shown in FIG. 1a, charge is transferred from substrate (10) through gate oxide (40) and is stored on floating gate (50) of the transistor. The amount of charge is set to one of two levels to indicate whether the cell has been programmed "on" of "off." "Reading" of the cell's state is accomplished by applying appropriate voltages to the cell source (30) and drain (35), and to control gate (70), and then sensing the amount of charge on floating gate (50). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling.

In the conventional memory cell shown in FIG. 1a, word lines (not shown) are connected to control gate (70) of the MOS transistor, while the length of the MOS transistor itself is defined by the source (30) drain (35) N+ regions shown in the same Figure. As is well known by those skilled in the art, the transistor channel is defined by masking the N+ regions. However, the channel length of the transistor varies depending upon the alignment of the floating gate (50) with the source and drain regions. This introduces significant variations in cell performance from die to die and from wafer to wafer. Furthermore, the uncertainty in the final position of the N+ regions causes variations in the series resistance of the bit lines connected to those regions, and hence additional variation in the cell performance. Finally, in order to insure that the resistance of the bit line is acceptably low, the bit lines over the N+ regions are formed wider than the required minimum, thereby giving rise to an increase in the overall area of the cell.

To overcome some of the problems cited above, Manley in U.S. Pat. No. 5,115,288 teaches a method that utilizes a conductive polysilicon spacer to define the gate length of the series transistor in a split-gate memory cell. The spacer is shown with reference numeral (80) in FIG. 1b. The memory cell of FIG. 1b is formed essentially in the same way the cell of FIG. 1a is formed except that after forming of the interpoly layer (60) and following well-known methods, a polysilicon spacer is formed adjacent to one of the opposing sides of the floating gate (50), as described in the same U.S. Pat. No. 5,115,288. The conductive spacer is insulated from the floating gate by the interpoly layer (60). Next, the spacer is utilized to define a self-aligned source region (30) while the floating gate is utilized in the self-aligned definition of the drain region (35). This process results in the floating gate extending only over a portion of the channel region in the manner of a conventional split-gate cell, and with the spacer being positioned over the remaining portion (21) of the channel between the floating gate and the source region. A conductive pol.ysilicon control gate (70) is then formed in electrical contact with the polysilicon conductive spacer. As seen in FIG. 1b, control gate (70) extends over floating gate (50), but is electrically insulated from the floating gate by the interpoly layer (60). The length of the polysilicon spacer (80) so formed can be controlled so as to eliminate the misalignment problems associated with conventional split-gate cells.

In U.S. Pat. No. 5,554,869, Chang uses two different compositions of spacers on the sides of the control gate in order to control the degree of misalignment in forming an EEPROM. Chittipeddi, et al., on the other hand, show, in U.S. Pat. No. 5,045,486, a method of preventing channeling during implantation through a gate in the fabrication of transistors. This invention discloses a more precise way of controlling the size and shape of spacers and hence, that of cell alignment, by employing a new method of etching nitride spacers in the manufacture of flash EEPROMs.

SUMMARY OF THE INVENTION

It is therefore an object of this invention to provide a method of forming nitride spacers in the manufacture of flash EEPROMs.

It is another object of this invention to provide a method of etching nitride spacers in the manufacture of flash EEPROMs.

It is yet another object of this invention to provide a method of improving alignment between polygate and impurity regions in the semiconductor substrate.

These objects are accomplished by providing a semiconductor substrate having a gate oxide layer formed thereon; forming a first polysilicon layer over said gate oxide layer; forming a mask layer over said first polysilicon layer; patterning said mask layer to define a floating gate in said first polysilicon layer; oxidizing said first polysilicon layer; removing said mask layer; etching said first polysilicon layer to form said floating gate; depositing a tunnel oxide layer over said first polysilicon layer; depositing a silicon nitride layer over said tunnel oxide layer; performing partial isotropic main-etch of said silicon nitride layer followed by overetch of said silicon nitride layer to form a nitride spacer; forming source and drain regions in said substrate using said nitride spacers for alignment; depositing an interpoly oxide layer over said substrate; forming a second polysilicon layer over said interpoly oxide layer; and patterning said second polysilicon layer to form a control gate and complete said flash EEPROM cell.

These objects are further accomplished by providing a semiconductor substrate having a gate oxide layer formed thereon; forming a first polysilicon layer over said gate oxide layer; forming a mask layer over said first polysilicon layer; patterning said mask layer to define a floating gate in said first polysilicon layer; oxidizing said first polysilicon layer; removing said mask layer; etching said first polysilicon layer to form said floating gate; depositing a tunnel oxide layer over said first polysilicon layer; depositing a silicon nitride layer over said tunnel oxide layer; performing partial isotropic main-etch and over-etch of said silicon nitride layer followed by anisotropic etching of said silicon nitride layer to form a nitride spacer; forming source and drain regions in said substrate using said nitride spacers for alignment; depositing an interpoly oxide layer over said substrate; forming a second polysilicon layer over said interpoly oxide layer; and patterning said second polysilicon layer to form a control gate and complete said flash EEPROM cell.

BRIEF DESCRIPTION OF THE DRAWINGS

FIGS. 1a–1b show partial cross-sectional view of a Flash EEPROM of prior art.

FIG. 2a is a partial cross-sectional view of a semiconductor substrate showing the deposition of a first polycrystalline silicon layer on a layer of gate oxide according to this invention.

FIG. 2b is a partial cross-sectional view of the substrate of FIG. 2a showing the patterning of the first polysilicon layer to form a floating gate of this invention.

DESCRIPTION OF THE PREFERRED EMBODIMENTS

Figure 2C:
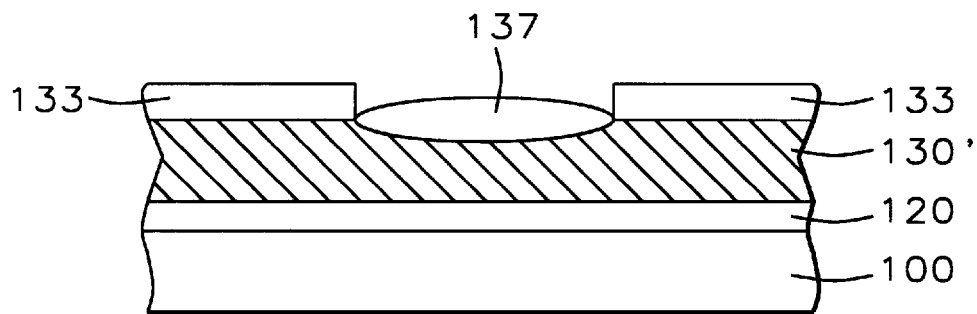
FIG. 2c is a partial cross-sectional view of the substrate of FIG. 2b showing the oxidation of the polysilicon layer according to this invention.

Referring now to the drawings, in particular to FIGS. 2a–2i, there are shown schematically steps of forming nitride spacers in a flash EEPROM cell by employing a set of new nitride etching processes.

In FIG. 2a, substrate (100), preferably silicon, is provided with a layer of gate oxide (120) upon which is deposited a layer of first polycrystalline silicon, or polysilicon, (130'). It is preferred that gate oxide (120) and polysilicon (130') have thicknesses between about 115 to 125 angstroms (Å) and 1500 to 1700 Å, respectively.

Figure 2D:
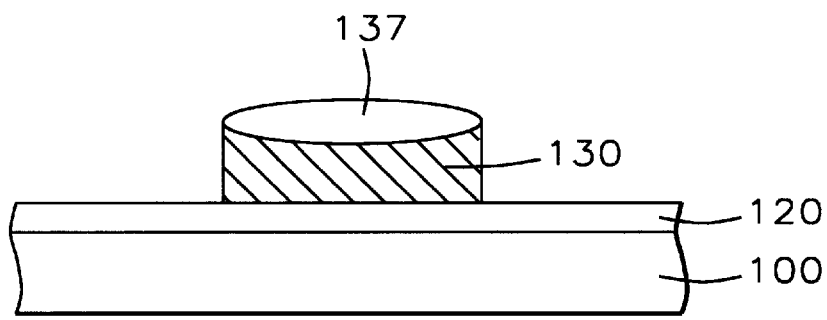
FIG. 2d is a partial cross-sectional view of the substrate of FIG. 2c showing the forming of the floating gate of this invention.

Polysilicon layer (130') is next covered with a layer of nitride (133) to a thickness between about 1400 to 1600 Å and then patterned (135) to form a mask for forming a floating gate of a memory cell as shown in FIG. 2b. First, the polysilicon layer exposed through mask opening (135) is oxidized in a furnace at temperature between about 900 to 950° C. Then the portion of the polysilicon exposed in opening (135) is thermally grown to form polyoxide (137) shown in FIG. 2c. Subsequently, nitride layer (133) is removed and using the hard polyoxide (137) as a mask, the remaining polysilicon portions (130') are removed by using an etch recipe comprising He, $CL_2$ and $C_2F_6$. Thus, first polygate (130), or floating gate, is formed as shown in FIG. 2d.

Figure 2E:
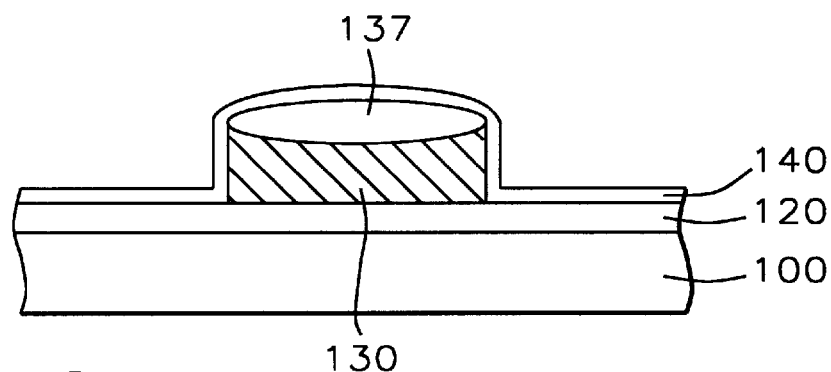
FIG. 2e is a partial cross-sectional view of the substrate of FIG. 2d showing the forming of tunnel oxide over the floating gate of this invention.
Figure 2F:
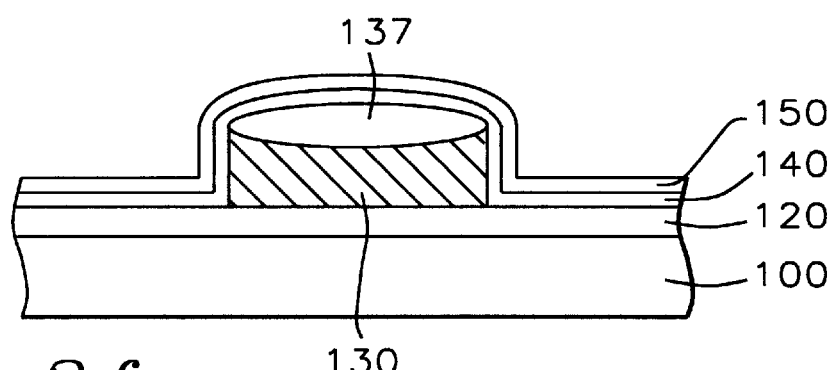
FIG. 2f is a partial cross-sectional view of the substrate of FIG. 2e showing the deposition of silicon nitride over the tunnel oxide according to this invention.

Next, a layer of high temperature oxide (HTO) (140) is formed over the substrate followed by a layer of nitride (150), preferably, silicon nitride $Si_3N_4$, as shown in FIGS. 2e and 2f. Preferably, HTO is a composite film of oxynitride formed at a temperature between about 650 to 700° C. and has a thickness between about 100 to 110 Å. HTO performs the function of a tunnel oxide. Silicon nitride has a thickness between about 170 to 180 Å, and is deposited at a temperature between about 750 to 800° C.

As a main feature and key aspect of this invention, the next steps are performed to form polygate spacers with better controlled dimensions and hence with better attributes for defining gate and channel lengths as discussed earlier in related art. It will be known to the workers in the field that oxide-spacer technology normally begins with the deposition of a doped oxide layer which covers the underlying topography conformally. The oxide layer is then anisotropically etched back until the underlying material is exposed. Unetched portions of the oxide at the vertical sides of the underlying features remain following this etch forming the spacers. However, the conventional anisotropic etching usually leaves the dimensions of the spacers indeterminate. This is because the directional anisotropic etching alone is difficult to control. It is disclosed in this invention that performing partial isotropic/anisotoropoic etching prior to anisotropic etching yields much more predictable results.

Thus, silicon nitride layer (150) of FIG. 2f is first subjected to a partial isotropic main-etch. The partial isotropic main-etch preferably has a ratio of 1:2 where etching in the vertical direction is twice that in the horizontal direction.

The main-etch is accomplished with a recipe comprising gas $SF_6$ flowing at a rate between about 15 to 20 standard cubic centimeteres per minute (sccm) and gas $O_2$ at a rate between about 4 to 5 sccm with power between about 75 to 80 W at a pressure between about 350 to 400 mtorr, and for between about 2 to 3 seconds. This is followed by an over-etch performed by using a recipe comprising gas $SF_6$ flowing at a rate between about 15 to 20 standard cubic centimeteres per minute (sccm) and gas $O_2$ at a rate between about 4 to 5 sccm with power between about 75 to 80 W at a pressure between about 350 to 400 mtorr, and for between about 1 to 2 seconds. The resulting silicon nitride spacers (155) shown in FIG. 2g are better controlled and are utilized to define precisely a self-aligned source region (191) while the floating gate (130) is utilized in the self-aligned definition of the drain region (192) separated by channel (190) shown in the completed memory cell of FIG. 2i.

Figure 2G:
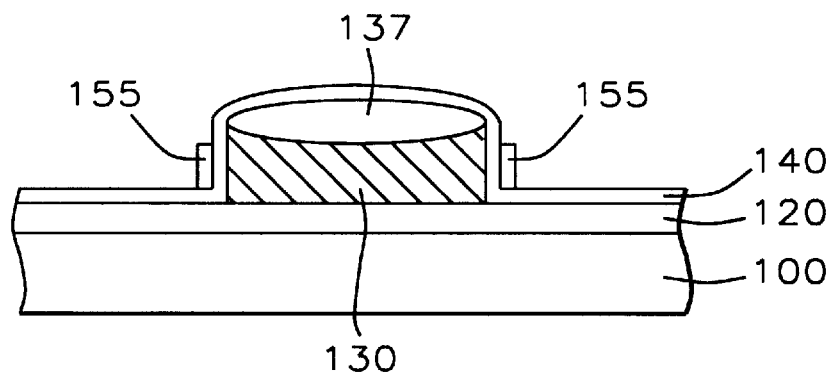
FIG. 2g is a partial cross-sectional view of the substrate of FIG. 2f showing the forming of nitride spacers of the first embodiment of this invention.
Figure 2H:
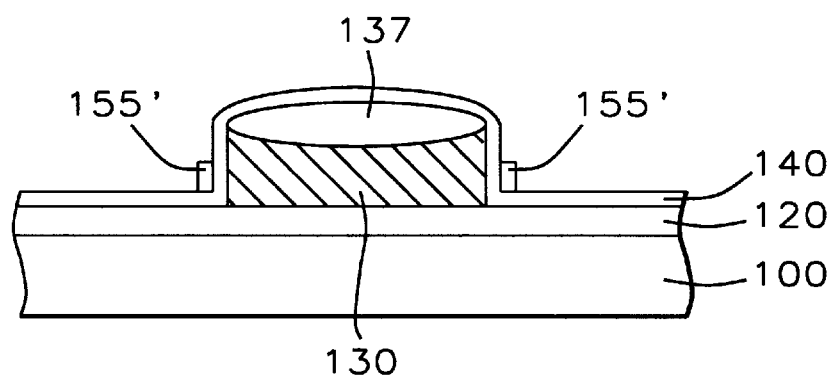
FIG. 2h is a partial cross-sectional view of the substrate of FIG. 2g showing the forming of nitride spacers of the second embodiment of this invention.

In a second embodiment of this invention, the process of forming silicon nitride spacers is further improved by performing an additional anisotropic etch following the partial isotropic etching shown in FIG. 2g. The additional anisotropic etch proceeds in the vertical direction and is performed with a recipe comprising gas $Cl_2$ flowing at a rate between about 120 to 130 sccm and He gas at a rate between about 70 to 80 sccm with power between about 190 to 200 W at a pressure between about 180 to 200 mtorr, and for between about 3 to 15 seconds. The silicon nitride spacers (155') shown in FIG. 2h are now even more precisely formed having, preferably, a height between about 200 to 700 Å.

Figure 2I:
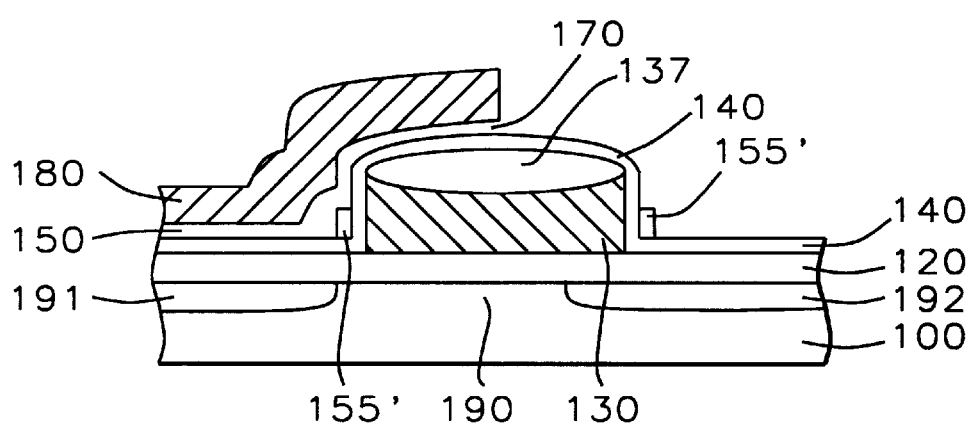
FIG. 2i is a partial cross-sectional view showing the completed structure of the flash EEPROM cell of this invention.

The source (191) and drain (192) regions of the memory cell shown in FIG. 2i are formed using nitride spacers of this invention with self-aligned implantation of arsenic at dosage levels between about $3 \times 10^{15}$ to $3.5 \times 10^{15}$ atoms/cm² at an energy between about 40 to 60 KEV. Subsequently, an interpoly layer (170), preferably oxide, is deposited over the substrate with a thickness between about 110 to 120 Å. Finally the memory cell structure is completed by forming a second polysilicon layer over the interpoly oxide, and patterning and forming control gate (180) shown in FIG. 2i. The second polysilicon layer has a thickness between about 1500 to 1600 Å.

While the invention has been particularly shown and described with reference to the preferred embodiments thereof, it will be understood by those skilled in the art that various changes in form and details may be made without departing from the spirit and scope of the invention.

What is claimed is:

1. A method of forming silicon nitride spacers in flash EEPROM cells comprising the steps of:

providing a semiconductor substrate having a gate oxide layer formed thereon;

forming a first polysilicon layer over said gate oxide layer;

forming a mask layer over said first polysilicon layer;

patterning said mask layer to define a floating gate in said first polysilicon layer;

oxidizing said first polysilicon layer;

removing said mask layer;

etching said first polysilicon layer to form said floating gate;

depositing a tunnel oxide layer over said floating gate;

depositing a silicon nitride layer over said tunnel oxide layer;

performing partial isotropic main-etch of said silicon nitride layer followed by over-etch of said silicon nitride layer to form silicon nitride spacers;

forming source and drain regions in said substrate using said silicon nitride spacers for alignment;

depositing an interpoly oxide layer over said substrate;

forming a second polysilicon layer over said interpoly oxide layer; and patterning said second polysilicon layer to form a control gate and complete said flash EEPROM cells.

2. The method of claim 1, wherein said semiconductor substrate is silicon.

3. The method of claim 1, wherein said gate oxide has a thickness between about 115 to 125 angstroms (Å).

4. The method of claim 1, wherein said first polysilicon layer has a thickness between about 1500 to 1700 Å.

5. The method of claim 1, wherein said mask layer is silicon nitride and has a thickness between about 1400 to 1600 Å.

6. The method of claim 1, wherein said oxidizing said first polysilicon layer is accomplished by thermal growth in a furnace at temperature between about 900 to 950° C.

7. The method of claim 1, wherein said etching said first p-olysilicon layer to form said floating gate is accomplished with a recipe comprising He, $Cl_2$ and $C_2F_6$.

8. The method of claim 1, wherein said tunnel oxide comprises high temperature oxide (HTO) formed at a temperature between about 650 to 700° C.

9. The method of claim 8, wherein said tunnel oxide has a thickness between about 100 to 110 Å.

10. The method of claim 1, wherein said silicon nitride is deposited at a temperature between about 750 to 800° C.

11. The method of claim 10, wherein said silicon nitride has a thickness between about 170 to 180 Å.

12. The method of claim 1, wherein said partial isotropic main-etch is performed by using a recipe comprising gas $SF_6$ flowing at a rate between about 15 to 20 standard cubic centimeteres per minute (sccm) and gas $O_2$ at a rate between about 4 to 5 sccm with power between about 75 to 80 W at a pressure between about 350 to 400 mtorr, and for between about 2 to 3 seconds.

13. The method of claim 12, wherein said partial isotropic main-etch has a higher selectivity in a vertical direction with a ratio of 1:2.

14. The method of claim 1, wherein said over-etch is performed by using a recipe comprising gas SF6 flowing at a rate between about 15 to 20 standard cubic centimeteres per minute (sccm) and gas $O_2$ at a rate between about 4 to 5 sccm with power between about 75 to 80 W at a pressure between about 350 to 400 mtorr, and for between about 1 to 2 seconds.

15. The method of claim 1, wherein said forming source and drain regions using said silicon nitride spacers is accomplished with self-aligned implantation of arsenic at dosage level between about $3 \times 10^{15}$ to $3.5 \times 10^{15}$ atoms/cm² at an energy between about 40 to 60 KEV.

16. The method of claim 1, wherein said second polysilicon layer has a thickness between about 1500 to 1600 Å.

17. A method of forming silicon nitride spacers in flash EEPROM cells comprising the steps of:

providing a semiconductor substrate having a gate oxide layer formed thereon;

forming a first polysilicon layer over said gate oxide layer;

forming a mask layer over said first polysilicon layer;

patterning said mask layer to define a floating gate in said first polysilicon layer;

oxidizing said first polysilicon layer;

removing said mask layer;

etching said first polysilicon layer to form said floating gate;

depositing a tunnel oxide layer over said floating gate;

depositing a silicon nitride layer over said tunnel oxide layer;

performing partial isotropic main-etch of said silicon nitride layer followed by over-etch of said silicon nitride layer to form silicon nitride spacers;

forming source and drain regions in said substrate using said silicon nitride spacers for alignment;

depositing an interpoly oxide layer over said substrate;

forming a second polysilicon layer over said interpoly oxide layer; and patterning said second polysilicpn layer to form a control gate and complete said flash EEPROM cells.

18. The method of claim 17, wherein said semiconductor substrate is silicon.

19. The method of claim 17, wherein said gate oxide has a thickness between about 115 to 125 angstroms (Å).

20. The method of claim 17, wherein said first polysilicon layer has a thickness between about 1500 to 1700 Å.

21. The method of claim 17, wherein said mask layer is silicon nitride and has a thickness between about 1400 to 1600 Å.

22. The method of claim 17, wherein said oxidizing said first polysilicon layer is accomplished by thermal growth in a furnace at temperature between about 900 to 950° C.

23. The method of claim 17, wherein said etching said first polysilicon layer to form said floating gate is accomplished with a recipe comprising He, $Cl_2$ and $C_2F_6$.

24. The method of claim 17, wherein said tunnel oxide comprises high temperature oxide (HTO) formed at a temperature between about 650 to 700° C.

25. The method of claim 24, wherein said tunnel oxide has a thickness between about 100 to 110 Å.

26. The method of claim 17, wherein said silicon nitride is deposited at a temperature between about 750 to 800° C.

27. The method of claim 26, wherein said silicon nitride has a thickness between about 170 to 180 Å.

28. The method of claim 17, wherein said partial isotropic main-etch and over-etch are performed by using a recipe comprising gas $SF_6$ flowing at a rate between about 15 to 20 standard cubic centimeteres per minute (sccm) and gas $O_2$ at a rate between about 4 to 5 sccm with power between about 75 to 80 W at a pressure between about 350 to 400 mtorr, and for between about 3 to 4 seconds.

29. The method of claim 28, wherein said partial isotropic main-etch has a higher selectivity in a vertical direction with a ratio of 1:2.

30. The method of claim 17, wherein said anisotropic etch is performed by using a recipe comprising gas $Cl_2$ flowing at a rate between about 120 to 130 sccm and He gas at a rate between about 70 to 80 sccm with power between about 190 to 200 W at a pressure between about 180 to 200 mtorr, and for between about 3 to 5 seconds.

31. The method of claim 17, wherein said forming source and drain regions using said silicon nitride spacers is accomplished with self-aligned implantation of arsenic at dosage levels between about $3\times10^{15}$ to $3.5\times10^{15}$ atoms/cm$^2$ at an energy between about 40 to 60 KEV.

32. The method of claim 17, wherein said interpoly oxide layer has a thickness between about 110 to 120 Å.

33. The method of claim 17, wherein said second polysilicon layer has a thickness between about 1500 to 1600Å.

* * * * *